(12) United States Patent
Lendvay

(10) Patent No.: US 11,538,545 B2
(45) Date of Patent: Dec. 27, 2022

(54) AUTO-POWER ON MODE FOR BIASED TESTING OF A POWER MANAGEMENT INTEGRATED CIRCUIT (PMIC)

(71) Applicant: Micron Technology, Inc., Boise, ID (US)

(72) Inventor: William Anthony Lendvay, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/237,875

(22) Filed: Apr. 22, 2021

(65) Prior Publication Data

US 2022/0343989 A1    Oct. 27, 2022

(51) Int. Cl.
*G11C 29/12* (2006.01)
*G11C 29/50* (2006.01)
*G11C 29/04* (2006.01)

(52) U.S. Cl.
CPC .. *G11C 29/12005* (2013.01); *G11C 29/50004* (2013.01); *G11C 2029/0407* (2013.01)

(58) Field of Classification Search
CPC ........ G11C 29/12005; G11C 29/50004; G11C 2029/0407
See application file for complete search history.

(56) References Cited

U.S. PATENT DOCUMENTS

| | | | |
|---|---|---|---|
| 2019/0056131 A1* | 2/2019 | Warren | F24F 11/30 |
| 2020/0050252 A1* | 2/2020 | Rowley | G11C 16/30 |
| 2021/0049086 A1* | 2/2021 | Bang | G11C 29/04 |
| 2021/0286421 A1* | 9/2021 | Wang | G06F 1/3215 |

* cited by examiner

*Primary Examiner* — Mohammed A Bashar
(74) *Attorney, Agent, or Firm* — Holland & Hart LLP

(57) ABSTRACT

Methods, systems, and devices supporting an auto-power on mode for biased testing of a power management integrated circuit (PMIC) are described. A system may program a PMIC of a memory system to a specific mode. The mode may cause the PMIC to apply a bias to a memory device of the memory system upon receiving power and independent of a command to apply the bias to the memory device. The system may transmit power to the memory system while controlling one or more operating conditions (e.g., temperature, humidity) for a threshold time. The PMIC may apply a bias to the memory device during the threshold time based on the PMIC being programmed to the mode and the transmitted power. The system may identify a capability or defect of the memory device resulting from transmitting the power to the memory system while controlling the operating conditions for the threshold time.

23 Claims, 5 Drawing Sheets

AUTO-POWER ON MODE FOR BIASED TESTING OF A POWER MANAGEMENT INTEGRATED CIRCUIT (PMIC)

FIELD OF TECHNOLOGY

The following relates generally to one or more systems for memory and more specifically to an auto-power on mode for biased testing of a power management integrated circuit (PMIC).

BACKGROUND

Memory devices are widely used to store information in various electronic devices such as computers, user devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
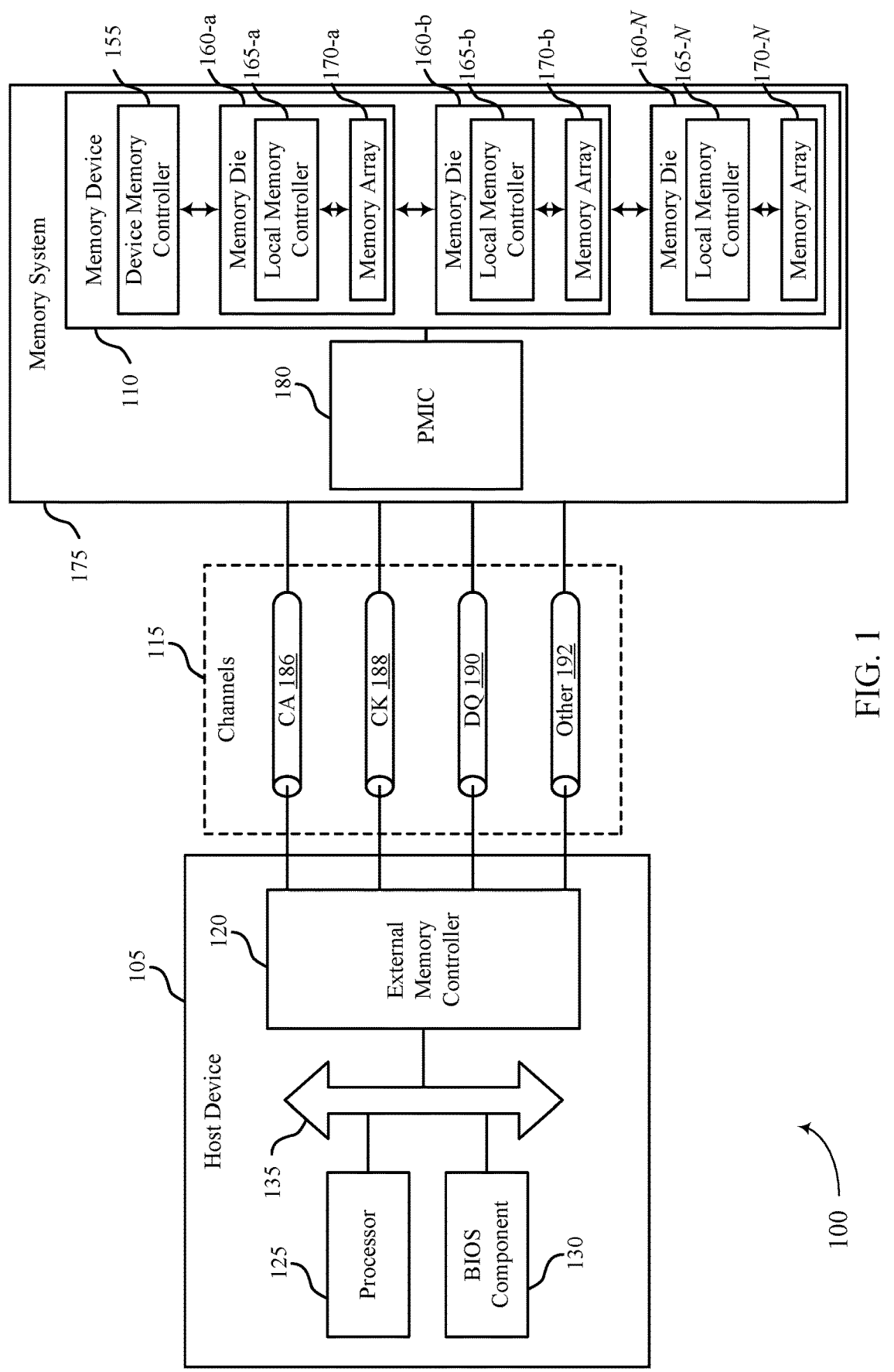
FIG. 1 illustrates an example of a system that supports an auto-power on mode for biased testing of a power management integrated circuit (PMIC) in accordance with examples as disclosed herein.

Some systems may test memory systems, memory devices, or both under specific operating conditions to determine whether the operating conditions result in failures at the memory systems, memory devices, or both. For example, a system (e.g., a testing system) may expose a memory system to a temperature (e.g., above a threshold temperature), a humidity (e.g., above a threshold humidity), or both for a threshold time while applying an electrical bias to a memory device of the memory system. Such testing may include a biased temperature humidity bias (THB) test, a biased highly accelerated stress test (HAST), or both. After the testing, the system may check for defects at the memory device. The biased testing may effectively test a memory system with power that is electrically connected to the components (e.g., memory devices) of the memory system. However, in some cases, a memory system may include a power management integrated circuit (PMIC) to provide power for one or more components (e.g., memory devices) of the memory system. The PMIC may supply power to a memory device upon receiving a command (e.g., an inter-integrated circuit (I2C) command, an improved inter-integrated circuit (I3C) command) indicating for the PMIC to apply a bias to the memory device. In some examples, a test system or components of a test system—such as a load board or test environment (e.g., test chamber) used for testing the memory system—may fail to support communication of such commands. Accordingly, the system may fail to support biased testing of a memory system. Additionally or alternatively, sending such commands to a memory system for the testing duration may involve significant messaging overhead (e.g., above a messaging threshold), significant processing overhead (e.g., above a processing threshold), or both.

According to various aspects described herein, a system for biased testing may program a PMIC of a memory system to a specific mode prior to insertion of the memory system into a load board or test chamber, which may be referred to as an auto-power on mode, to support biased testing. For example, a system may perform an initial functionality test to determine whether a memory device of a memory system has a defect. If initial defects are not detected for the memory device, the system may program the PMIC of the memory system to the auto-power on mode. The auto-power on mode may cause the PMIC to apply a bias to the memory device of the memory system upon receiving power and independent of a command (e.g., an I2C command, an I3C command) to apply the bias to the memory device. The system may supply power to the memory system while controlling one or more operating conditions (e.g., temperature, humidity) for a threshold time. The PMIC may apply a bias to the memory device during the threshold time using the supplied power and based on the PMIC being programmed to the auto-power on mode, for example, as part of a biased THB test or a biased HAST or both. Upon completion of the test (e.g., the biased THB test, the biased HAST), the system may reprogram the PMIC to deactivate the auto-power on mode. The system may perform a second functionality test to identify a capability or defect of the memory device resulting from transmitting the power to the memory system while controlling the operating conditions for the threshold time. For example, the system may identify whether the biased THB test, the biased HAST, or both causes physical defects (e.g., electrochemical migration, passivation, corrosion, PN junction leakage) on the memory device, which may result in one or more failures at the memory device. Accordingly, the system may support biased testing of a memory device powered by a PMIC without sending commands to the PMIC when the memory system is inserted in the test environment.

Features of the disclosure are initially described in the context of systems and dies as described with reference to FIG. 1. Features of the disclosure are further described in the context of a testing system and a testing process described with reference to FIGS. 2 and 3. These and other features of the disclosure are further illustrated by and described with reference to an apparatus diagram and a flowchart that relate to an auto-power on mode for biased testing of a PMIC as described with reference to FIGS. 4 and 5.

FIG. 1 illustrates an example of a system 100 that supports an auto-power on mode for biased testing of a PMIC in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110). In some examples, the memory device 110 may be an example or component of a memory system 175 or a memory subsystem. For example, a memory system 175 (e.g., a memory module) may include one or more memory devices 110 and a PMIC 180 to provide power to the one or more memory devices 110. In some examples, a memory system 175 or memory sub-system may be referred to as a memory device 110 or memory devices.

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105. In some cases, the host device 105 may be an example or an aspect of a testing system. For example, the host device 105 of another aspect of the system 100 may perform tests on the memory device 110 (e.g., to test for capabilities, defects, or both of a memory device 110).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general-purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

In some examples, the system 100 or the host device 105 may include an input component, an output component, or both. An input component may represent a device or signal external to the system 100 that provides information, signals, or data to the system 100 or its components. In some examples, an input component may include a user interface or interface with or between other devices. In some examples, an input component may be a peripheral that connects with the system 100 via one or more peripheral components or may be managed by an input/output controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that connects with the system 100 via one or more peripheral components or may be managed by an input/output controller. Additionally or alternatively, a testing system or testing device may send inputs to the system 100 and receive outputs from the system to test the functionality of the system 100 (e.g., the memory device 110).

The memory device 110 may include a device memory controller 155 and one or more memory dies 160 (e.g., memory chips) to support a desired capacity or a specified capacity for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, the system 100 may include a memory system 175 including one or more memory devices 110. The memory system 175 may use a PMIC 180 to generate power for the one or more memory devices 110. For example, a controller of the memory system 175, the device memory controller 155, or both may be downstream of the PMIC 180, such that an external power source (e.g., at the host device 105 or external to the system 100) may not be able to send power to the controller of the memory system 175, the device memory controller 155, or both without sending a command to the PMIC 180. As an example, the memory system 175 may be a differential dual in-line memory module (DDIMM), a double data rate 5 (DDR5) synchronous dynamic random access memory (SDRAM) module, a double data rate 6 (DDR6) SDRAM module, or any other memory module (e.g., a server-grade module) which may use a PMIC 180 to generate dual in-line memory module (DIMM) power for one or more components of the memory system 175, such as the memory device 110.

To enable the PMIC 180, a system or device (e.g., the host device 105 or a system or device external to the system 100) may send a command to the PMIC 180. An I2C command, an I3C command, or another command may trigger the PMIC to energize one or more components of the memory system 175 downstream of the PMIC 180. For example, a host controller (e.g., at the host device 105) may send such a command to the PMIC 180 to trigger a power ramp sequence at the PMIC 180, and the PMIC 180 may apply a bias to one or more components of the memory system 175 in response to the command, such as the memory device 110.

Some systems may perform biased testing of memory devices 110, memory systems 175, or both. To perform a biased test (e.g., a THB test, a HAST), a memory system that does not include a PMIC may be inserted into a DIMM slot of a load board and the load board (with the memory system)

may be inserted into a test chamber. A testing system may expose the memory system to one or more operating conditions within the test chamber, such as a temperature above a temperature threshold, a humidity above a humidity threshold, or both. Additionally, to support a biased test, the testing system may apply an electrical bias to the memory system, including to one or more memory devices of the memory system. In some examples, an external power supply (e.g., a bench power supply) may energize the memory system. After the memory system is exposed to the operating conditions for a threshold time (e.g., several hundred hours, or some other time period), the memory system may be removed from the test chamber and tested functionally to verify whether the memory system includes any failures due to the biased testing. Such failures may include electrochemical migration, passivation, corrosion, or PN junction leakage or on a memory device, which may result in open circuits, short circuits, or loss of memory retention. Such biased testing may effectively test a memory system in which power inputs are electrically connected to the components of the memory system (e.g., without a PMIC controlling power within the memory system), such as registered DIMM (RDIMM), unregistered DIMM (UDIMM), small outline DIMM (SoDIMM), load-reduction DIMM (LRDIMM), or other memory systems.

However, if a memory system 175 includes a PMIC 180, applying power to the memory system 175 may fail to energize the components of the memory system 175, such as a memory device 110, due to the PMIC 180. For example, the memory system 175 may be inserted into a load board and connected to one or more power supplies (e.g., a 12 volt (V) supply and a 3.3V supply). However, if an external power supply transmits power to the memory system 175, the power may reach the PMIC 180 and may not be sent further without a command (e.g., I2C command, I3C command) triggering the PMIC 180 to send the bias to one or more components downstream of the PMIC 180, such as a memory device 110. If a load board fails to support such commands (e.g., if the load board does not include I2C, I3C, or other side-band bus access), the load board may fail to trigger the PMIC 180 to apply a bias to the memory device 110. Additionally or alternatively, in some cases, a test chamber may fail to support connecting a side-band bus to a memory system 175 with a shielded interface (e.g., a connection using the side-band bus) such that an external system may send I2C or I3C commands to the PMIC 180 during testing. Accordingly, the load board, the test chamber, or both may fail to support biased testing for a memory system 175 including a PMIC 180.

As described herein, a testing system may trigger an auto-power on mode at a PMIC 180 to support biased testing for a memory system 175 including a PMIC 180. For example, the auto-power on mode may allow for an external power source to transmit power to the memory system 175, and the PMIC 180 may automatically send the power to one or more downstream components, such as a memory device 110, based on the PMIC 180 operating in the auto-power on mode.

Figure 2:
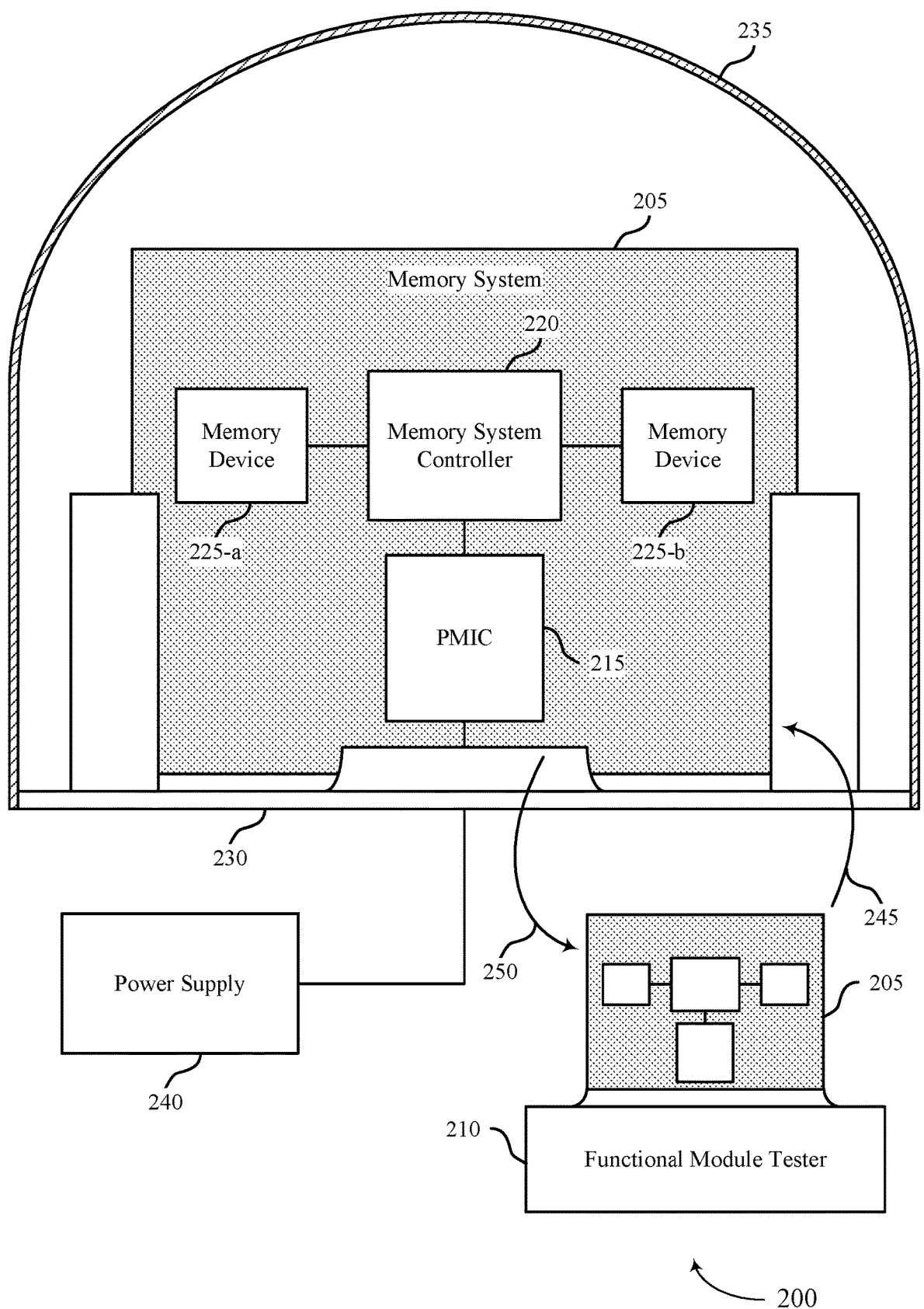
FIG. 2 illustrates an example of a testing system that supports an auto-power on mode for biased testing of a PMIC in accordance with examples as disclosed herein.

FIG. 2 illustrates an example of a testing system 200 that supports an auto-power on mode for biased testing of a PMIC in accordance with examples as disclosed herein. The testing system 200 may include a functional module tester 210, a test chamber 235, a power supply 240, or any combination thereof. The testing system 200 may perform biased testing on a memory system 205 including a PMIC 215. For example, the testing system 200 may be configured to program the PMIC 215 of the memory system 205 to an auto-power on mode, such that the power supply 240 may transmit power to the memory system controller 220 and the power may be sent to one or more memory devices 225 (e.g., memory device 225-a and memory device 225-b, each with power controlled by the PMIC 215). Using the auto-power on mode, the testing system 200 may apply a bias to a memory device 225 of the memory system 205 while the memory system 205 is in the test chamber 235. Accordingly, the testing system 200 may perform a biased THB test, a biased HAST, or both on a memory system 205 including a PMIC 215.

The testing system 200 may include one or more separate devices or systems that are configured to perform different operations. For example, the testing system 200 may include a functional module tester 210. The functional module tester 210 may include one or more connections that support sending commands to the memory system 205. For example, the memory system 205 may be connected to the functional module tester 210, and the functional module tester 210 may send signals indicative of commands to the memory system 205 to perform one or more operations. In some cases, the commands may include read commands, write commands, or a combination thereof to test the functionality of the memory system 205 or to test the functionality of a memory device 225 of the memory system 205. Testing the functionality may involve identifying one or more capabilities of a memory device 225, one or more defects of the memory device 225, or some combination thereof based on how the memory device 225 handles commands and stores data. Additionally or alternatively, the functional module tester 210 may send signals indicative of I2C commands, I3C commands, or other commands configured to modify or trigger an operation at the PMIC 215. For example, after initially testing the functionality of the memory device 225-a, the memory device 225-b, or both using the functional module tester 210, the functional module tester 210 may send a command to the PMIC 215 to program the PMIC 215 to an auto-power on mode.

If the PMIC 215 is programmed to the auto-power on mode and receives power, the PMIC 215 may automatically turn on one or more power rails and energize one or more components of the memory system 205 downstream of the PMIC 215. For example, the PMIC 215 may control power for the memory device 225-a and the memory device 225-b (e.g., the memory device 225-a and the memory device 225-b may be downstream of the PMIC 215, such that power goes to the PMIC 215 before being sent to one or more of the memory devices 225). When operating in the auto-power on mode, the PMIC 215 turns on one or more outputs to one or more circuits of one or more memory devices 225 (e.g., using a memory system controller 220) and may apply a bias to the one or more memory devices 225 independent of a command (e.g., an I2C command, an I3C command) to apply the bias to the one or more memory devices 225.

At 245, the memory system 205 including the PMIC 215 may be inserted into a load board 230. For example, the load board 230 may include multiple DIMM slots for memory systems 205, and the memory system 205 may be plugged into a DIMM slot of the multiple DIMM slots (e.g., for testing). In some examples, multiple memory systems 205 may be plugged into the load board 230 at different slots to support concurrent testing of the memory systems 205. The load board 230 may fail to support sending I2C or I3C commands to the PMIC 215 (e.g., based on lacking an I2C or I3C interface at the load board 230, such as a connection or bus supporting the communication of I2C or I3C commands). Accordingly, the testing system 200 may fail to trigger a PMIC 215 operating in a standard operating mode to send power to the memory devices 225 of the memory system 205. However, if the PMIC 215 is in the auto-power on mode, the load board 230 may send the power to the PMIC 215, and the PMIC 215 may automatically send the power to the memory devices 225 (e.g., independent of an I2C or I3C command).

The load board 230 with the memory system 205—and, in some cases, one or more additional memory systems—may be placed in a test chamber 235. In some examples, the test chamber 235 may be referred to as a "pressure cooker" test chamber. The test chamber 235 may be configured to expose the memory system 205 to a set of operating conditions for a threshold time. The set of operating conditions may include a temperature, a humidity, or a combination of these or other operating conditions. As an example, the test chamber 235 may subject the memory system 205 to a temperature satisfying a threshold temperature (e.g., above a threshold temperature), a humidify satisfying a threshold humidity (e.g., above a threshold humidity), or both for a time duration satisfying a threshold time (e.g., at least several hundred hours).

The testing system 200 may additionally apply a bias to the memory system 205 while the memory system 205 is in the test chamber 235 using the PMIC 215 programmed to the auto-power on mode. Applying the bias may more accurately test the memory system 205 operating in relatively extreme conditions (e.g., relatively high temperature, relatively high humidity) than an unbiased test, because the voltage applied to the memory system 205 may reflect more accurate operating conditions of the memory system 205. In addition, biased testing may stress components (e.g., transistors, conductors) to help accelerate (e.g., relative to unbiased testing) defects that may cause failures in operation. The load board 230 may be connected to a power supply 240 (e.g., an external power supply 240). Additionally, the memory system 205 plugged into the load board 230 may be connected to voltage inputs from the load board 230. Accordingly, the power supply 240 may transmit power to the load board 230 using a connection, and the load board 230 may send the power to the PMIC 215 of the memory system 205. Due to the PMIC 215 operating in the auto-power on mode, the PMIC 215 may send the power to the memory device 225-*a*, the memory device 225-*b*, or both (e.g., without receiving an I2C or I3C command indicating for the PMIC 215 to send the power). As such, the testing system 200 may apply an electrical bias to one or more components of the memory system 205 (e.g., the memory device 225-*a* and the memory device 225-*b*) during the temperature and humidity testing. In some cases, the power supply 240 may send a constant voltage to the memory system 205 throughout the duration of the testing in the test chamber 235. In some other cases, the power supply 240 may vary the voltage (e.g., based on a schedule, one or more triggers, user inputs, or some combination thereof). Additionally or alternatively, the power supply 240 may refrain from applying the voltage for at least a portion of the duration of the testing in the test chamber 235 (e.g., based on a schedule, one or more triggers, user inputs, or some combination thereof).

After the threshold time for testing the memory system 205 in the test chamber 235, at 250, the load board 230 and the memory system 205 may be removed from the test chamber 235 and the memory system 205 may be removed from the DIMM slot of the load board 230. Additionally, the testing system 200 (e.g., the functional module tester 210) may reprogram the PMIC 215 to deactivate the auto-power on mode. In some examples, a device, such as the functional module tester 210, may send a signal indicative of an I2C command, an I3C command, or another command configured to modify the mode of the PMIC 215. If the auto-power on mode is deactivated, the PMIC 215 may refrain from energizing components of the memory system 205 downstream of the PMIC 215 unless the PMIC 215 receives a command to send power to one or more components.

The functional module tester 210 may retest the memory system 205 after the testing in the test chamber 235. For example, the memory system 205 may be reconnected to the functional module tester 210, and the functional module tester 210 may retest the functionality of the memory system 205. The functional module tester 210 may identify one or more capabilities of a memory device 225 of the memory system 205, one or more defects of the memory device 225 of the memory system 205, or both. By comparing the capabilities, defects, or both identified before the testing and after the testing in the test chamber 235, the testing system 200 may determine whether the testing (e.g., the biased temperature and humidity testing) affected the memory device 225. The testing system 200 may verify if any failures occurred at the memory device 225 as a result of the biased testing in the test chamber 235. For example, the testing system 200 may detect opens, shorts, or retention failures due to electrochemical migration, passivation, corrosion, or PN junction leakage on the memory device 225 based on one or more failures occurring at the memory device 225. By supporting biased testing using the auto-power on mode, the testing system 200 may thoroughly test a memory system 205 including a PMIC 215 to uncover potential reliability risks based on operating in relatively extreme conditions (e.g., temperature, humidity) with an electrical bias.

Figure 3:
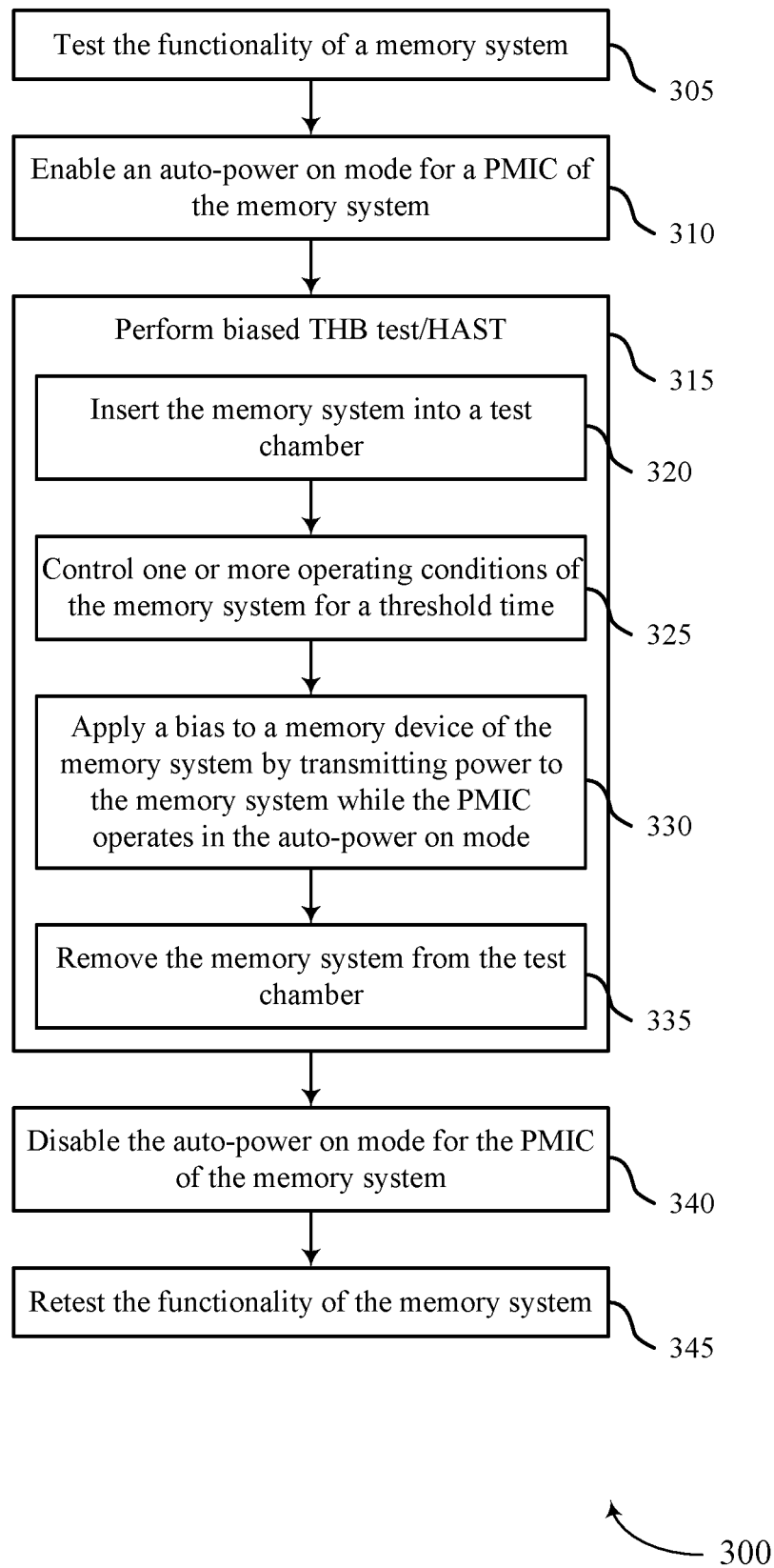
FIG. 3 illustrates an example of a process flow that supports an auto-power on mode for biased testing of a PMIC in accordance with examples as disclosed herein.

FIG. 3 illustrates an example of a process flow 300 that supports an auto-power on mode for biased testing of a PMIC in accordance with examples as disclosed herein. The process flow 300 may be performed by a system 100 or a testing system 200 as described with reference to FIGS. 1 and 2. For example, the process flow 300 may be performed by a single system or a set of systems (e.g., a functional testing system and a test chamber). In some cases, alternative examples of the following may be implemented, where some operations may be performed in a different order than described or are not performed at all. Additionally or alternatively, operations may include additional features not mentioned below, or further processes may be added.

At 305, the testing system may test the functionality of a memory system. For example, a functional module tester may test the functionality of one or more memory devices of a memory module (e.g., a memory system) to determine an initial set of capabilities, an initial set of defects, or both for the one or more memory devices. In some cases, a memory system with one or more detected defects may not be tested further by the testing system.

At 310, the testing system may enable an auto-power on mode at a PMIC of the memory system. For example, a system or device (e.g., the functional module tester) may program the PMIC of the memory system to a mode for causing the PMIC to apply a bias to a memory device of the memory system upon receiving power and independent of a command (e.g., I2C command, I3C command) to apply the bias to the memory device. In some cases, the system or device may send, to the PMIC, a signal indicative of a command that enables the auto-power on mode at the PMIC. The PMIC may include non-volatile memory, in which a register may correspond to the auto-power on mode. Enabling the auto-power on mode may involve programming the register with a value (e.g., 1) to indicate the auto-power on mode, while disabling the auto-power on mode may involve programming the register with a different value (e.g., 0) to indicate a different mode (e.g., a standard operating mode). The auto-power on mode may turn on one or more outputs of the PMIC to one or more circuits of the memory device.

At 315, the testing system may perform a biased test on the memory system in a test chamber. The biased test may be an example of a biased THB test, a biased HAST, or both. Performing the biased test may involve 320, 325, 330, 335, or any combination thereof.

At 320, the memory system may be inserted into a test chamber. For example, the memory system may be plugged into a DIMM slot of a load board (which may include one or more additional DIMM slots, where each slot may or may not include a connected memory system), and the load board, with the connected memory system, may be placed in the test chamber. The test chamber may be an example of a controlled environment, in which one or more operating conditions may be set for the one or more memory systems in the load board.

At 325, the testing system may control one or more operating conditions of the memory system for a threshold time. For example, while the memory system is in the test chamber, one or more environmental conditions within the test chamber may be configured to test the capabilities of the memory system. The test chamber may subject the memory system to a temperature satisfying a threshold temperature, a humidity satisfying a threshold humidity, or both. The memory system may operate under such conditions for the threshold time.

Additionally, at 330, the testing system may apply a bias to a memory device of the memory system. For example, the testing system (e.g., using a power source external to the test chamber) may transmit power to the memory system. Because the PMIC is operating in the auto-power on mode, the PMIC may apply the bias to the memory device in response to the transmitted power. The testing system may apply the bias to the memory device while controlling the one or more operating conditions within the test chamber at 325, such that the temperature and humidity testing involves biased temperature and humidity testing of the memory device.

At 335, the memory system may be removed from the test chamber after the threshold time. For example, the load board with the connected one or more memory systems may be removed from the test chamber upon completion of the biased THB test, the biased HAST, or both.

At 340, the testing system may disable the auto-power on mode at the PMIC of the memory system. For example, a system or device (e.g., the functional module tester) may reprogram the PMIC of the memory system to a mode for causing the PMIC to apply a bias to a memory device of the memory system upon receiving a command (e.g., I2C command, I3C command) to apply the bias to the memory device. In some cases, the system or device may send, to the PMIC, a signal indicative of a command that disables the auto-power on mode at the PMIC.

At 345, the testing system may retest the functionality of the memory system. The functional module tester may test the functionality of one or more memory devices of the memory module (e.g., the memory system) to determine a set of capabilities, a set of defects, or both for the one or more memory devices resulting from the testing at 315. For example, the testing system may identify a capability of the memory device or a defect of the memory device resulting from transmitting the power to the memory system (e.g., applying a bias to the memory device) while controlling the one or more operating conditions for the threshold time. In some examples, the testing system may compare an initial capability or an initial defect of the memory device (e.g., identified at 305) to the capability or the defect of the memory device resulting from the biased testing (e.g., identified at 345) to determine if any failures occurred at the memory device as a result of the biased testing.

The process flow 300 may enable a testing system (e.g., a single device, a system of devices, multiple systems of devices) to perform biased testing on a memory system including a PMIC even if a test chamber, a load board, or both used for the testing are not configured to support (e.g., communicate with) the PMIC. By support biased testing, the testing system may reduce the latency involved in testing the memory system, may determine additional potential failures of a memory device, or both as compared to a system performing unbiased testing.

Figure 4:
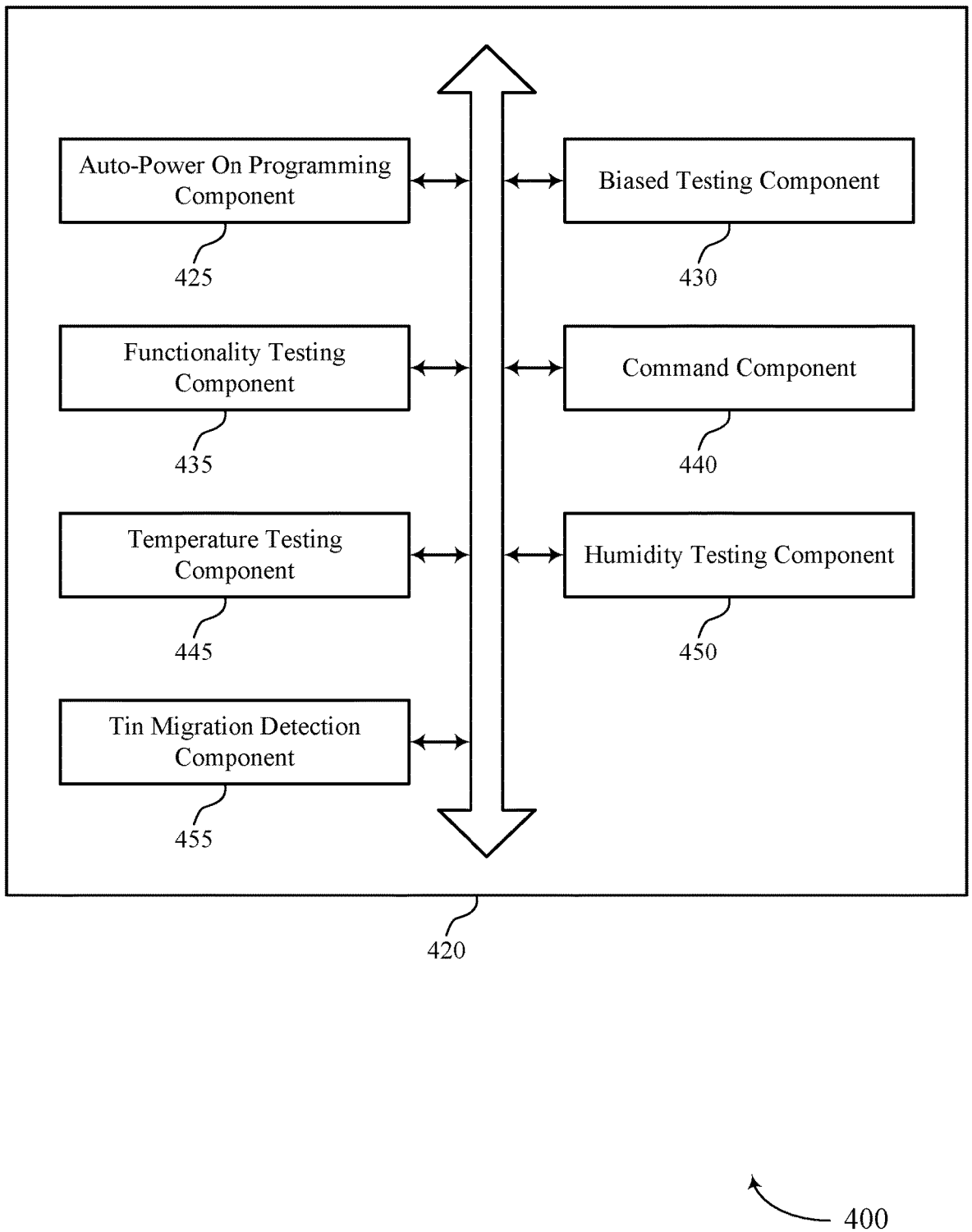
FIG. 4 shows a block diagram of a testing system that supports an auto-power on mode for biased testing of a PMIC in accordance with examples as disclosed herein.

FIG. 4 shows a block diagram 400 of a testing system 420 that supports an auto-power on mode for biased testing of a PMIC in accordance with examples as disclosed herein. The testing system 420 may be an example of aspects of a testing system as described with reference to FIGS. 1 through 3. The testing system 420, or various components thereof, may be an example of means for performing various aspects of an auto-power on mode for biased testing of a PMIC as described herein. For example, the testing system 420 may include an auto-power on programming component 425, a biased testing component 430, a functionality testing component 435, a command component 440, a temperature testing component 445, a humidity testing component 450, a tin migration detection component 455, or any combination thereof. Each of these components may communicate, directly or indirectly, with one another (e.g., via one or more buses). Additionally or alternatively, the testing system 420 may include a single device or a set of devices, where different devices of the set of devices may be configured to perform different tests (or aspects of tests) described herein with reference to the testing system 420.

The auto-power on programming component 425 may be configured as or otherwise support a means for programming a PMIC of a memory system to a mode (e.g., an auto-power on mode). The mode may cause the PMIC to apply a bias to a memory device of the memory system upon receiving power and independent of a command to apply the bias to the memory device. The biased testing component 430 may be configured as or otherwise support a means for transmitting power to the memory system while controlling one or more operating conditions of the memory system for a threshold time. The PMIC may apply the bias to the memory device based at least in part on programming the mode for the PMIC and transmitting the power to the memory system. The functionality testing component 435 may be configured as or otherwise support a means for identifying a capability of the memory device or a defect of the memory device resulting from transmitting the power to the memory system while controlling the one or more operating conditions for the threshold time.

In some examples, the auto-power on programming component 425 may be configured as or otherwise support a means for reprogramming the PMIC of the memory system, subsequent to transmitting the power to the memory system while controlling the one or more operating conditions for the threshold time, to disable the mode that causes the PMIC to apply the bias to the memory device of the memory system upon receiving the power and independent of the command to apply the bias to the memory device using the PMIC.

In some examples, the command component 440 may be configured as or otherwise support a means for sending, to the PMIC, a signal indicative of the command to apply the bias to the memory device, where identifying the capability of the memory device or the defect of the memory device is based at least in part on the command to apply the bias to the memory device and the reprogramming.

In some examples, the functionality testing component 435 may be configured as or otherwise support a means for identifying an initial capability of the memory device or an initial defect of the memory device prior to programming the PMIC of the memory system to the mode. In some examples, the functionality testing component 435 may be configured as or otherwise support a means for comparing the initial capability or the initial defect of the memory device to the capability or the defect of the memory device resulting from transmitting the power to the memory system while controlling the one or more operating conditions for the threshold time.

In some examples, the command component 440 may be configured as or otherwise support a means for sending, to the PMIC, a signal indicative of a second command, where the PMIC of the memory system is programmed to the mode based at least in part on the second command.

In some examples, the temperature testing component 445 may be configured as or otherwise support a means for subjecting the memory system to a temperature satisfying a temperature threshold, where the one or more operating conditions include the temperature. In some examples, the humidity testing component 450 may be configured as or otherwise support a means for subjecting the memory system to a humidity satisfying a humidity threshold, where the one or more operating conditions include the humidity.

In some examples, the memory system is inserted into a slot of a load board including a power supply connection and a plurality of slots supporting insertion of a plurality of memory systems, where the power is transmitted to the memory system using the power supply connection and a power source external to the load board. In some examples, the load board may fail to support a capability to send, to the PMIC, a signal indicative of the command to apply the bias to the memory device using the PMIC. In some examples, the memory system is removed from the slot of the load board subsequent to transmitting the power to the memory system while controlling the one or more operating conditions for the threshold time, where identifying the capability of the memory device or the defect of the memory device is based at least in part on the memory system being removed from the slot.

In some examples, the tin migration detection component 455 may be configured as or otherwise support a means for detecting an electrochemical migration of tin on the memory device based at least in part on identifying the defect of the memory device resulting from transmitting the power to the memory system while controlling the one or more operating conditions for the threshold time.

In some examples, the mode programmed for the PMIC turns on one or more outputs of the PMIC to one or more circuits of the memory device. In some examples, the bias is applied to the memory device at a constant voltage. In some examples, the command to apply the bias to the memory device using the PMIC may be an example of an I2C command. In some examples, transmitting the power to the memory system while controlling the one or more operating conditions for the threshold time includes a biased THB test or a biased HAST or both.

Figure 5:
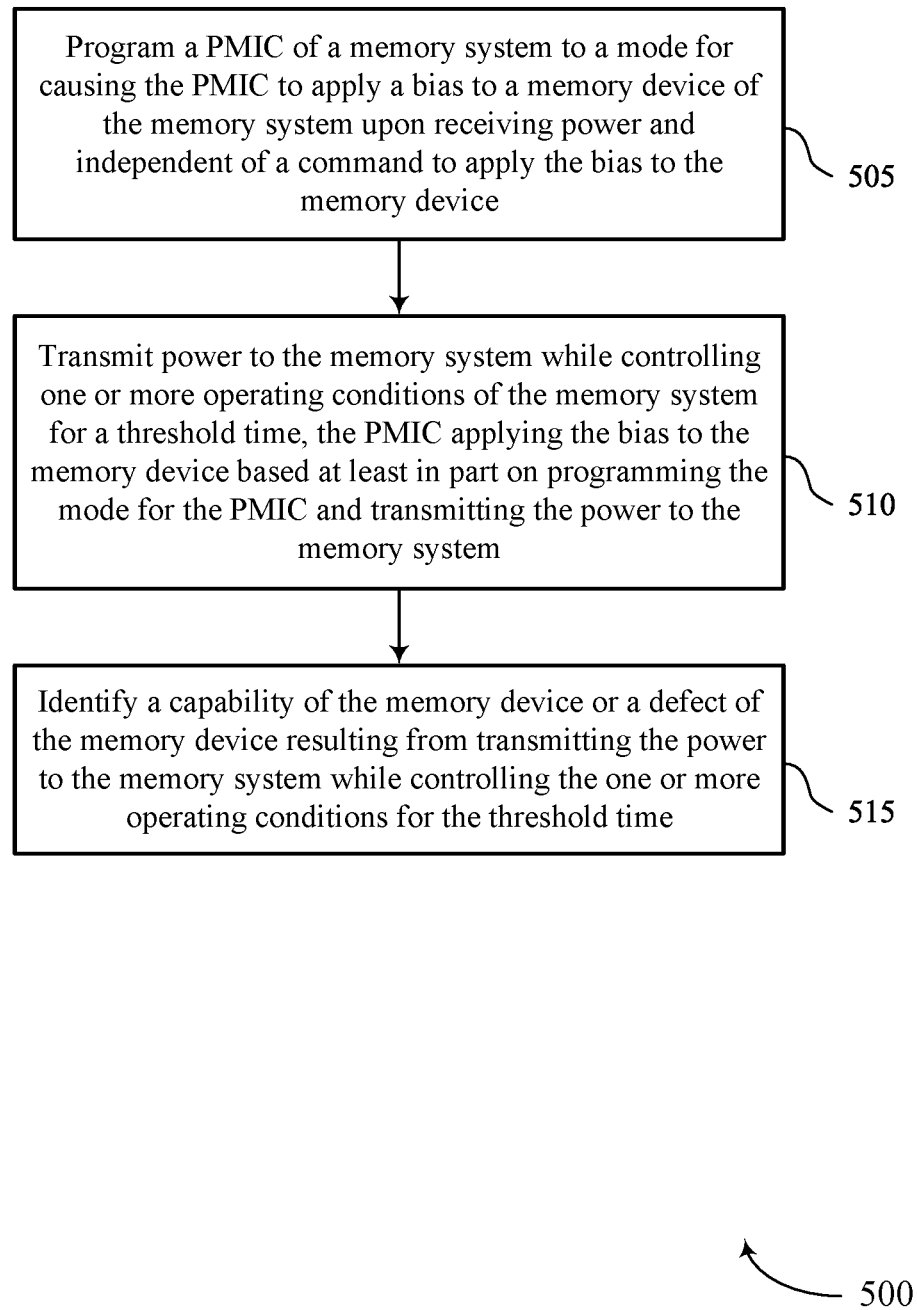
FIG. 5 shows a flowchart illustrating a method or methods that support an auto-power on mode for biased testing of a PMIC in accordance with examples as disclosed herein.

FIG. 5 shows a flowchart illustrating a method 500 that supports an auto-power on mode for biased testing of a PMIC in accordance with examples as disclosed herein. The operations of method 500 may be implemented by a system (e.g., a testing system) or its components as described herein. For example, the operations of method 500 may be performed by a testing system as described with reference to FIGS. 1 through 4. In some examples, a testing system may execute a set of instructions to control the functional elements of the device to perform the described functions. Additionally or alternatively, the testing system may perform aspects of the described functions using special-purpose hardware.

At 505, the method may include programming a PMIC of a memory system to a mode for causing the PMIC to apply a bias to a memory device of the memory system upon receiving power and independent of a command to apply the bias to the memory device. The operations of 505 may be performed in accordance with examples as described at 310 with reference to FIG. 3. In some examples, aspects of the operations of 505 may be performed by an auto-power on programming component 425 as described with reference to FIG. 4.

At 510, the method may include transmitting power to the memory system while controlling one or more operating conditions of the memory system for a threshold time. The PMIC may apply the bias to the memory device based at least in part on programming the mode for the PMIC and transmitting the power to the memory system. The operations of 510 may be performed in accordance with examples as described at 315 with reference to FIG. 3. In some examples, aspects of the operations of 510 may be performed by a biased testing component 430 as described with reference to FIG. 4.

At 515, the method may include identifying a capability of the memory device or a defect of the memory device resulting from transmitting the power to the memory system while controlling the one or more operating conditions for the threshold time. The operations of 515 may be performed in accordance with examples as described at 345 with reference to FIG. 3. In some examples, aspects of the operations of 515 may be performed by a functionality testing component 435 as described with reference to FIG. 4.

In some examples, an apparatus as described herein may perform a method or methods, such as the method 500. The apparatus may include, features, circuitry, logic, means, or instructions (e.g., a non-transitory computer-readable medium storing instructions executable by a processor) for programming a PMIC of a memory system to a mode for causing the PMIC to apply a bias to a memory device of the memory system upon receiving power and independent of a command to apply the bias to the memory device, transmitting power to the memory system while controlling one or more operating conditions of the memory system for a threshold time, the PMIC applying the bias to the memory device based at least in part on programming the mode for the PMIC and transmitting the power to the memory system, and identifying a capability of the memory device or a defect of the memory device resulting from transmitting the power to the memory system while controlling the one or more operating conditions for the threshold time.

Some examples of the method 500 and the apparatus described herein may further include operations, features, circuitry, logic, means, or instructions for reprogramming the PMIC of the memory system, subsequent to transmitting the power to the memory system while controlling the one or more operating conditions for the threshold time, to disable the mode that causes the PMIC to apply the bias to the memory device of the memory system upon receiving the power and independent of the command to apply the bias to the memory device using the PMIC.

Some examples of the method 500 and the apparatus described herein may further include operations, features, circuitry, logic, means, or instructions for sending, to the PMIC, a signal indicative of the command to apply the bias to the memory device, where identifying the capability of the memory device or the defect of the memory device may be based at least in part on the command to apply the bias to the memory device and the reprogramming.

Some examples of the method 500 and the apparatus described herein may further include operations, features, circuitry, logic, means, or instructions for identifying an initial capability of the memory device or an initial defect of the memory device prior to programming the PMIC of the memory system to the mode and comparing the initial capability or the initial defect of the memory device to the capability or the defect of the memory device resulting from transmitting the power to the memory system while controlling the one or more operating conditions for the threshold time.

Some examples of the method 500 and the apparatus described herein may further include operations, features, circuitry, logic, means, or instructions for sending, to the PMIC, a signal indicative of a second command, where the PMIC of the memory system may be programmed to the mode based at least in part on the second command.

Some examples of the method 500 and the apparatus described herein may further include operations, features, circuitry, logic, means, or instructions for subjecting the memory system to a temperature satisfying a temperature threshold, where the one or more operating conditions include the temperature.

Some examples of the method 500 and the apparatus described herein may further include operations, features, circuitry, logic, means, or instructions for subjecting the memory system to a humidity satisfying a humidity threshold, where the one or more operating conditions include the humidity.

In some examples of the method 500 and the apparatus described herein, the memory system may be inserted into a slot of a load board including a power supply connection and a plurality of slots supporting insertion of a plurality of memory systems, where the power may be transmitted to the memory system using the power supply connection and a power source external to the load board.

In some examples of the method 500 and the apparatus described herein, the load board fails to support a capability to send, to the PMIC, a signal indicative of the command to apply the bias to the memory device using the PMIC.

In some examples of the method 500 and the apparatus described herein, the memory system may be removed from the slot of the load board subsequent to transmitting the power to the memory system while controlling the one or more operating conditions for the threshold time, where identifying the capability of the memory device or the defect of the memory device may be based at least in part on the memory system being removed from the slot.

Some examples of the method 500 and the apparatus described herein may further include operations, features, circuitry, logic, means, or instructions for detecting an electrochemical migration of tin on the memory device based at least in part on identifying the defect of the memory device resulting from transmitting the power to the memory system while controlling the one or more operating conditions for the threshold time.

In some examples of the method 500 and the apparatus described herein, the mode programmed for the PMIC turns on one or more outputs of the PMIC to one or more circuits of the memory device.

In some examples of the method 500 and the apparatus described herein, the bias may be applied to the memory device at a constant voltage.

In some examples of the method 500 and the apparatus described herein, the command to apply the bias to the memory device using the PMIC may include an I2C command.

In some examples of the method 500 and the apparatus described herein, the transmitting the power to the memory system while controlling the one or more operating conditions for the threshold time may include a biased THB test or a biased HAST or both.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or technologies such as infrared, radio, and microwave, then the coaxial cable, fiber optic cable, twisted pair, digital subscriber line (DSL), or technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   programming, by a functional module tester, a power management integrated circuit (PMIC) of a memory system to a mode for causing the PMIC to apply a bias to a memory device of the memory system upon receiving power and independent of a command to apply the bias to the memory device;
   transmitting, by a load board while the memory system is coupled with the load board in a test chamber that is separate from the functional module tester, power to the memory system while controlling, using the test chamber, one or more operating conditions of the memory system for a threshold time, the PMIC applying the bias to the memory device based at least in part on programming the mode for the PMIC and transmitting the power to the memory system; and
   identifying, by the functional module tester, a capability of the memory device or a defect of the memory device resulting from transmitting the power to the memory system while controlling the one or more operating conditions for the threshold time.

2. The method of claim 1, further comprising:
   reprogramming the PMIC of the memory system, subsequent to transmitting the power to the memory system while controlling the one or more operating conditions for the threshold time, to disable the mode that causes the PMIC to apply the bias to the memory device of the memory system upon receiving the power and independent of the command to apply the bias to the memory device using the PMIC.

3. The method of claim 2, further comprising:
   sending, to the PMIC, a signal indicative of the command to apply the bias to the memory device, wherein identifying the capability of the memory device or the defect of the memory device is based at least in part on the command to apply the bias to the memory device and the reprogramming.

4. The method of claim 1, further comprising:
   identifying an initial capability of the memory device or an initial defect of the memory device prior to programming the PMIC of the memory system to the mode; and
   comparing the initial capability or the initial defect of the memory device to the capability or the defect of the memory device resulting from transmitting the power to the memory system while controlling the one or more operating conditions for the threshold time.

5. The method of claim 1, further comprising:
   sending, to the PMIC, a signal indicative of a second command, wherein the PMIC of the memory system is programmed to the mode based at least in part on the second command.

6. The method of claim 1, further comprising:
   subjecting the memory system to a temperature satisfying a temperature threshold, wherein the one or more operating conditions comprise the temperature.

7. The method of claim 1, further comprising:
   subjecting the memory system to a humidity satisfying a humidity threshold, wherein the one or more operating conditions comprise the humidity.

8. The method of claim 1, wherein the memory system is inserted into a slot of a load board comprising a power supply connection and a plurality of slots supporting insertion of a plurality of memory systems, wherein the power is transmitted to the memory system using the power supply connection and a power source external to the load board.

9. The method of claim 8, wherein the load board fails to support a capability to send, to the PMIC, a signal indicative of the command to apply the bias to the memory device using the PMIC.

10. The method of claim 8, wherein the memory system is removed from the slot of the load board subsequent to transmitting the power to the memory system while controlling the one or more operating conditions for the threshold time, wherein identifying the capability of the memory device or the defect of the memory device is based at least in part on the memory system being removed from the slot.

11. The method of claim 1, further comprising:
    detecting an electrochemical migration of tin on the memory device based at least in part on identifying the defect of the memory device resulting from transmitting the power to the memory system while controlling the one or more operating conditions for the threshold time.

12. The method of claim 1, wherein the mode programmed for the PMIC turns on one or more outputs of the PMIC to one or more circuits of the memory device.

13. The method of claim 1, wherein the bias is applied to the memory device at a constant voltage.

14. The method of claim 1, wherein the command to apply the bias to the memory device using the PMIC comprises an Inter-Integrated Circuit (I2C) command.

15. The method of claim 1, wherein transmitting the power to the memory system while controlling the one or more operating conditions for the threshold time comprises a Biased Temperature Humidity Bias (THB) test or a Biased Highly Accelerated Stress Test (HAST) or both.

16. An apparatus, comprising:
    logic associated with a system, wherein the logic is configured to cause the apparatus to:
    program, by a functional module tester, a power management integrated circuit (PMIC) of a memory system to a mode configured to cause the PMIC to apply a bias to a memory device of the memory system upon receiving power and independent of a command to apply the bias to the memory device;
    transmit, by a load board while the memory system is coupled with the load board in a test chamber that is separate from the functional module tester, power to the memory system while controlling, using the test chamber, one or more operating conditions of the memory system for a threshold time, the PMIC configured to apply the bias to the memory device based at least in part on programming the mode for the PMIC and transmitting the power to the memory system; and identify, by the functional module tester, a capability of the memory device or a defect of the memory device resulting from transmitting the power to the memory system while controlling the one or more operating conditions for the threshold time.

17. The apparatus of claim 16, wherein the logic is further configured to cause the apparatus to:

reprogram the PMIC of the memory system, subsequent to transmitting the power to the memory system while controlling the one or more operating conditions for the threshold time, to disable the mode that causes the PMIC to apply the bias to the memory device of the memory system upon receiving the power and independent of the command to apply the bias to the memory device using the PMIC.

18. The apparatus of claim 16, wherein the logic is further configured to cause the apparatus to:

identify an initial capability of the memory device or an initial defect of the memory device prior to programming the PMIC of the memory system to the mode; and compare the initial capability or the initial defect of the memory device to the capability or the defect of the memory device resulting from transmitting the power to the memory system while controlling the one or more operating conditions for the threshold time.

19. The apparatus of claim 16, wherein the logic is further configured to cause the apparatus to:

subject the memory system to a temperature satisfying a temperature threshold, wherein the one or more operating conditions comprise the temperature.

20. The apparatus of claim 16, wherein the logic is further configured to cause the apparatus to:

subject the memory system to a humidity satisfying a humidity threshold, wherein the one or more operating conditions comprise the humidity.

21. A non-transitory computer-readable medium storing code, the code comprising instructions executable by a processor to:

program, by a functional module tester, a power management integrated circuit (PMIC) of a memory system to a mode for causing the PMIC to apply a bias to a memory device of the memory system upon receiving power and independent of a command to apply the bias to the memory device;

transmit, by a load board while the memory system coupled with the load board in a test chamber that is separate from the functional module tester, power to the memory system while controlling, using the test chamber, one or more operating conditions of the memory system for a threshold time, the PMIC applying the bias to the memory device based at least in part on programming the mode for the PMIC and transmitting the power to the memory system; and identify, by the functional module tester, a capability of the memory device or a defect of the memory device resulting from transmitting the power to the memory system while controlling the one or more operating conditions for the threshold time.

22. The non-transitory computer-readable medium of claim 21, wherein the instructions are further executable by the processor to:

reprogram the PMIC of the memory system, subsequent to transmitting the power to the memory system while controlling the one or more operating conditions for the threshold time, to disable the mode that causes the PMIC to apply the bias to the memory device of the memory system upon receiving the power and independent of the command to apply the bias to the memory device using the PMIC.

23. The non-transitory computer-readable medium of claim 21, wherein the instructions are further executable by the processor to:

identify an initial capability of the memory device or an initial defect of the memory device prior to programming the PMIC of the memory system to the mode; and compare the initial capability or the initial defect of the memory device to the capability or the defect of the memory device resulting from transmitting the power to the memory system while controlling the one or more operating conditions for the threshold time.

* * * * *